United States Patent
Lee

(10) Patent No.: US 7,199,028 B2
(45) Date of Patent: Apr. 3, 2007

(54) METHOD FOR MANUFACTURING SEMICONDUCTOR DEVICE

(75) Inventor: Chang Jin Lee, Ichon-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 197 days.

(21) Appl. No.: 10/739,746

(22) Filed: Dec. 18, 2003

(65) Prior Publication Data

US 2004/0266212 A1 Dec. 30, 2004

(30) Foreign Application Priority Data

Jun. 30, 2003 (KR) .................. 10-2003-0043624

(51) Int. Cl.
*H01L 21/20* (2006.01)

(52) U.S. Cl. .................................... 438/478

(58) Field of Classification Search ............. 438/592, 438/478; 216/2
See application file for complete search history.

(56) References Cited

U.S. PATENT DOCUMENTS

| 4,897,360 | A | * | 1/1990 | Guckel et al. ................. 216/2 |
| 4,990,997 | A | * | 2/1991 | Nishida ....................... 257/751 |
| 5,347,161 | A | * | 9/1994 | Wu et al. ..................... 257/756 |
| 5,349,325 | A | * | 9/1994 | McAllister ................... 338/307 |
| 5,441,904 | A | * | 8/1995 | Kim et al. .................... 438/592 |
| 5,767,004 | A | * | 6/1998 | Balasubramanian et al. .......................... 438/592 |
| 5,970,369 | A | * | 10/1999 | Hara et al. ................... 438/488 |
| 6,114,196 | A | * | 9/2000 | Lin et al. ..................... 438/197 |
| 6,162,716 | A | * | 12/2000 | Yu et al. ...................... 438/592 |
| 6,228,701 | B1 | * | 5/2001 | Dehm et al. ................. 438/240 |
| 6,287,944 | B1 | * | 9/2001 | Hara et al. ................... 438/488 |
| 6,297,529 | B1 | * | 10/2001 | Imai ............................. 257/318 |
| 6,495,432 | B2 | * | 12/2002 | Chen et al. ................... 438/515 |
| 6,800,543 | B2 | * | 10/2004 | Taguwa ........................ 438/592 |

FOREIGN PATENT DOCUMENTS

KR 1997-51990 7/1997

\* cited by examiner

*Primary Examiner*—Carl Whitehead, Jr.
*Assistant Examiner*—Monica D. Harrison
(74) *Attorney, Agent, or Firm*—Marshall, Gerstein & Borun LLP

(57) ABSTRACT

Provided is a method for manufacturing a semiconductor device capable of preventing a solution from penetrating a lower layer by forming a poly silicon layer stacked of the films having the different grain boundary structures at border, wherein the solution is used in the subsequent strip and cleaning process.

8 Claims, 3 Drawing Sheets

METHOD FOR MANUFACTURING SEMICONDUCTOR DEVICE

BACKGROUND

1. Field of the Invention

The present invention relates to a method for manufacturing a semiconductor device and, more particularly, to a method for manufacturing a semiconductor device capable of preventing a chemical solution from penetrating a lower layer, wherein the chemical solution is used at the time of performing a strip process and a cleaning process in the manufacturing process of the semiconductor device.

2. Discussion of Related Art

Conventionally, a strip process and a cleaning process are performed in a manufacturing process of a semiconductor device. In the strip process and the cleaning process, a chemical solution such as HF and buffered oxide etchant (BOE; the mixed solution of HF and $NH_4F$ as 100:1 or 300:1) etc., is used. However, since the solution is capable of penetrating a lower layer there below, it may damage the lower layer when used.

For example, in the manufacturing process of a flash device, shallow trench isolation (STI) process is used as a device separation process. As for performing STI process in short, a tunnel oxide film, a first poly silicon film (or pad oxide film) and a pad nitride film are deposited on a semiconductor substrate sequentially, and then, a trench is formed thereof by performing an etching process using an isolation mask. In the following step, a wall oxide film is formed inside of the trench by performing the wall oxide process. After depositing a high-density plasma (HDP) oxide film for filling the trench, a separation film is formed by performing sequentially a chemical mechanical polishing (CMP) process and the strip process for removing the pad nitride film. Next, deposition of a second poly silicon film for a floating gate is performed.

Typically, the first poly silicon film is deposited as a monolayer for simplifying process, whereby the grain boundary structure of the first poly silicon film comes to be a column direction as a whole. In such a structure, a chemical solution is subject to penetrate a tunnel oxide film and a semiconductor substrate via the grain boundary of the first poly silicon film, wherein the solution is used in the strip process and the subsequent pre-treatment cleaning process (before depositing the second poly silicon film) for removing the pad nitride film. The tunnel oxide film and the semiconductor substrate are damaged due to penetration of the chemical solution. As a result, the tunnel oxide film is damaged when a program operation and an erase operation are performed in the flash device by fouler nordheim (F-N) Tunneling method, so that the leakage current from a channel or a contact layer to a floating gate is subject to generate, resulting in the characteristic of the flash device deteriorating.

A need, therefore, exists for a method of manufacturing a semiconductor device capable of preventing the chemical solution from being penetrated into a lower layer.

SUMMARY OF THE INVENTION

The present invention is directed to a method for manufacturing a semiconductor device capable of preventing a chemical solution used in a strip process and a cleaning process from penetrating a lower layer, and the damage of a lower layer caused by penetration of a chemical solution.

Further, the present invention can be used to prevent the damage of a tunnel oxide film caused by penetration of a chemical solution used in the manufacturing process of a flash device.

According to a preferred embodiment of the present invention, there is provided a method for preventing a deterioration of a property in the semiconductor device, wherein the deterioration results from damage of the lower layer generated by penetration of a chemical solution used in the manufacturing process of a flash device.

According to another embodiment of the present invention, a method is provided for manufacturing a semiconductor device comprising the steps of; providing a semiconductor substrate having a lower layer; and forming at least 2-layered film to prevent a solution used in the subsequent processes from penetrating the lower layer, and subjecting $N_2$ purge process to an upper face in the lower film of said 2-layered film, to have a different grain boundary structure at border of the films, whereby changing the grain boundary structure of the upper face in the lower film.

In the aforementioned of a method for manufacturing a semiconductor device according to another embodiment of the present invention, the 2-layered film is preferably poly silicon layer.

In the aforementioned of a method for manufacturing a semiconductor device according to another embodiment of the present invention, the $N_2$ purge process is preferably performed in situ with deposition of the lower layer film.

In the aforementioned of a method for manufacturing a semiconductor device according to another embodiment of the present invention, the $N_2$ purge process is preferably performed with $N_2$ gas at a pressure in the range of 0.1 Torr to 0.5 Torr and a temperature in the range of 580° C. to 650° C.

In the aforementioned of a method for manufacturing a semiconductor device according to another embodiment of the present invention, the 2-layered film is formed through a deposition process, said process is performed with $SiH_4$ gas at a pressure in the range of 0.1 Torr to 0.5 Torr and a temperature in the range of 580° C. to 650° C.

DETAILED DESCRIPTION OF PREFERRED EMBODIMENTS

The above and other objects, features and advantages of the present invention will become apparent from the following descriptions and the appended claims, taken in conjunction with the accompanying drawings in which like parts or elements denoted by like reference symbols.

FIGS. 1 to 6 are cross-sectional views for explaining a method for manufacturing a semiconductor device according to a preferred embodiment of the present invention sequentially. Table.1 shows process recipes used in the process of FIGS. 1 to 6

TABLE 1

| step | | Time(min) | gas SiH₄ | gas N₂ | Pressure (Torr) | Temperature (° C.) |
|---|---|---|---|---|---|---|
| The first process | pre-deposition step | 1 | 125 cc | Not use | 0.2 | 620 |
| | Deposition step | X(variable) | 250 cc | Not use | 0.2 | 620 |
| | Pumping step | 1 | Closed (excluding) | Not use | Not applied | 620 |
| Purge process | N₂ purge step | 1 | Not use | Opened | 0.2 | 620 |
| The second process | Pre-deposition step | 1 | Opened (supplying) | Closed | 0.2 | 620 |
| | Deposition step | X | Opened | Not use | 0.2 | 620 |
| | Pumping step | 1 | Closed | Not use | Not applied | 620 |
| Purge process | N₂ purge step | 1 | Not use | Opened | 0.2 | 620 |
| The 3rd process | Pre-deposition step | 1 | Opened | Closed | 0.2 | 620 |
| | Deposition step | X | Opened | Not use | 0.2 | 620 |

Figure 1:
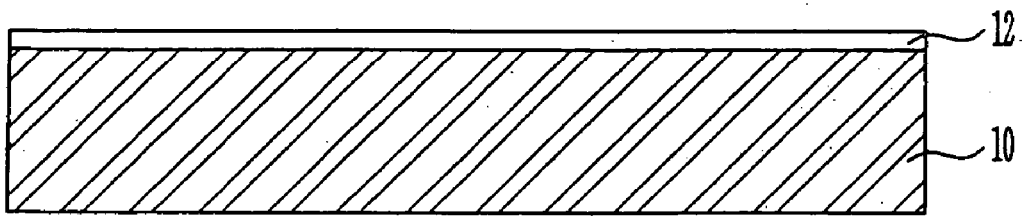
FIGS. 1 to 6 are cross-sectional views for explaining a method for manufacturing a semiconductor device according to a preferred embodiment of the present invention.

Referring to FIG. 1, the lower layer 12 is formed on the semiconductor substrate 10. The aforementioned lower layer 12 is an oxide film, a nitride film, an insulator film and a conductive film, or a stacked film including at least two of them.

Figure 2:
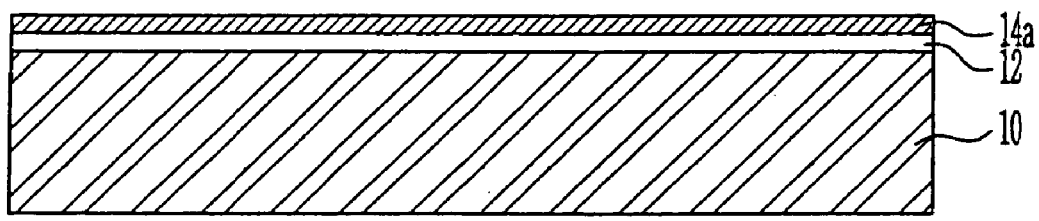

Referring to FIG. 2, the first poly silicon film 14a is deposited on the lower layer 12 by performing the first process described in table 1 sequentially. At this time, it is preferable that the thickness of the first poly silicon film 14a is one third of the target value in the poly silicon layer 14 (referring to FIG. 6).

The pre-deposition step of the first process is performed to make the ambient atmosphere of the deposition chamber (not shown) prior to the deposition process. The pre-deposition step is performed at a pressure in the range of 0.1 Torr to 0.5 Torr, preferably 0.2 Torr, and a temperature in the range of 580° C. to 650° C., preferably 620° C. Under the condition as described above, SiH₄ gas is supplied into the deposition chamber up to 125 cc wherein, the influx of SiH₄ gas is not confined to 125 cc, but it is variable depending on the process. The pre-deposition step is performed, preferably, within 1 minute, after SiH₄ gas is supplied.

The aforementioned deposition step of the first process is performed, preferably, by increasing the influx of the SiH₄ gas up to 250 cc, while keeping the pressure and the temperature constantly at the process condition of the pre-deposition step. Wherein, the influx of SiH₄ gas is not confined to 250 cc, but it is variable depending on the target thickness value. In addition, the process time of the deposition step is variable depending on the target thickness.

The pumping step of the first process is performed to exhaust an un-reacted gas to the outside, after the first poly silicon film 14a is deposited on the lower layer 12, wherein the gas remains not reacted in the deposition chamber. The pumping step is performed until all the un-reacted gas existing in the deposition chamber is exhausted. In this embodiment, 1 minute is preferable, considering the progress of process.

Figure 7:
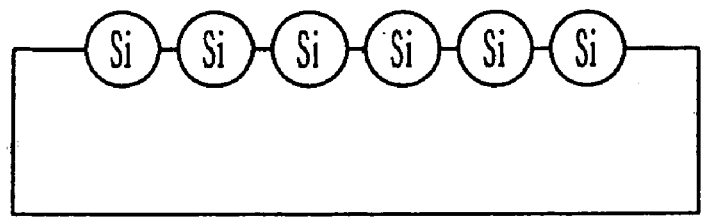
FIG. 7 shows a grain boundary structure of an upper face in a first and a second poly silicon film as shown in FIG. 2 and FIG. 4.

By performing the pre-deposition step, the deposition step and the pumping step, as described above, the first process is completed. Accordingly, the first poly silicon film 14a is deposited on the lower layer 12, and a plurality of atoms of silicon (hereinafter referred to as a "Si") come to exist on the upper part of said first poly silicon film 14a, as shown in FIG. 7.

Figure 3:
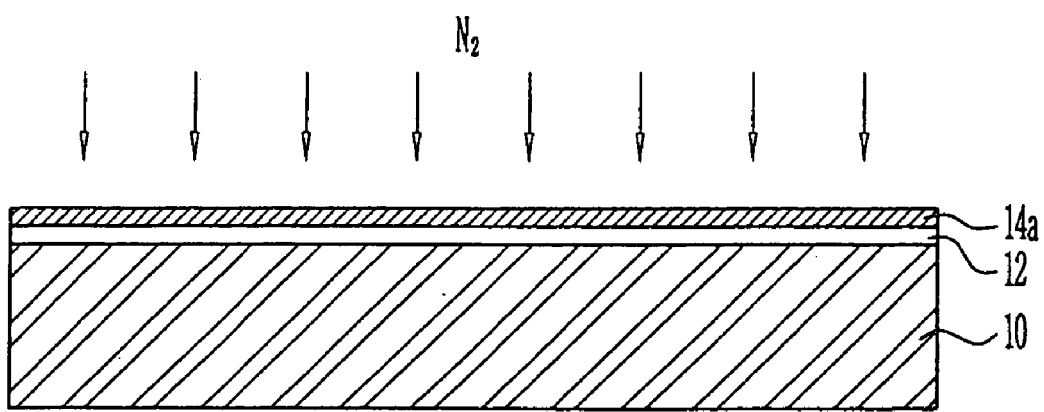

Referring to FIG. 3, a purge process using N₂ gas is applied to the first poly silicon film 14a. The aforementioned purge process is performed in situ regardless of the first process as described in FIG. 2 and the time delay. Preferably, the purge process is performed with N₂ gas for 1 minute under the same deposition conditions (the pressure and the temperature) as the first process.

Figure 8A:
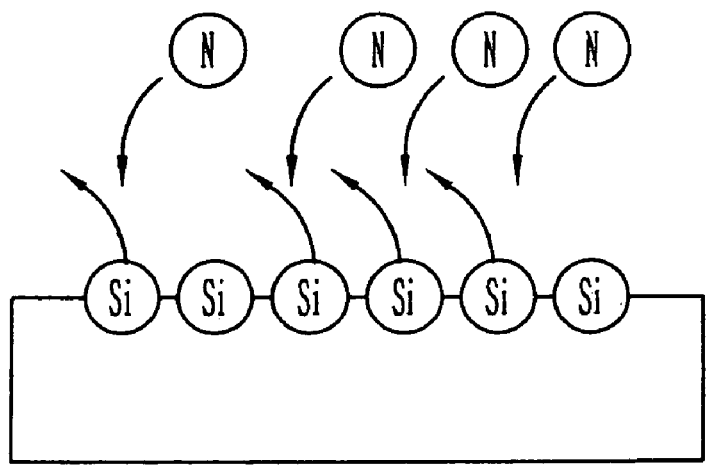
FIGS. 8A and 8B show the substitution of N for Si, by the $N_2$ purge process performed in FIG. 3 and FIG. 5.
Figure 8B:
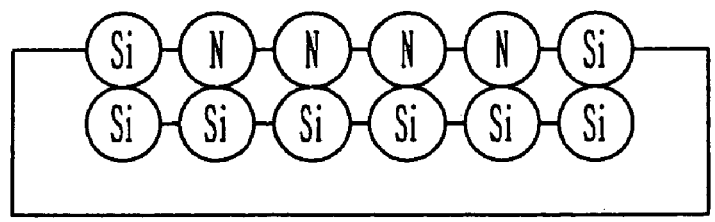

As shown in FIG. 8A, Si and an atom of nitrogen (hereinafter referred to as a "N") cause the substitution reaction on the upper part of the first poly silicon film 14a. Therefore, as shown in FIG. 8B, N comes to dominate on the upper part of the first poly silicon film 14a compared to Si. Accordingly, the grain boundary structure comes to change in the upper part of the first poly silicon film 14a.

Figure 4:
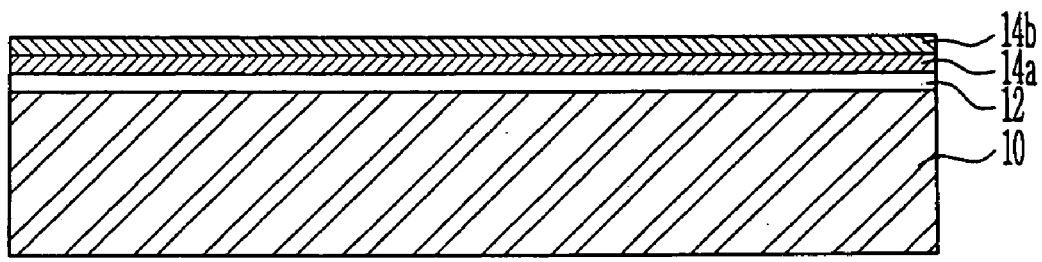

Referring to FIG. 4, the second poly silicon film 14b is deposited on the first poly silicon film 14a through the second process in the same manner of the first process. The aforementioned second process includes pre-deposition step, deposition step, and pumping step like the first process.

At this time, the second poly silicon film 14b on the upper part of the first poly silicon film 14a is deposited in a manner of having the different grain boundary structure from that of the upper part of the first poly silicon film 14a. Generally, the silicon film is deposited with the same grain boundary structure, as grown. However, as the upper part of the first poly silicon film 14a contains more N than Si, the second poly silicon film 14b combines with the upper part of the first poly silicon film 14a, whereby it becomes not to grow. The reason is that Si of the second poly silicon film 14b does not combine with N which is included in the upper part of the first poly silicon film 14a. The resulting lower part of the second poly silicon film 14b and the upper part of the first poly silicon film 14a do not bond completely, but partially.

Figure 5:
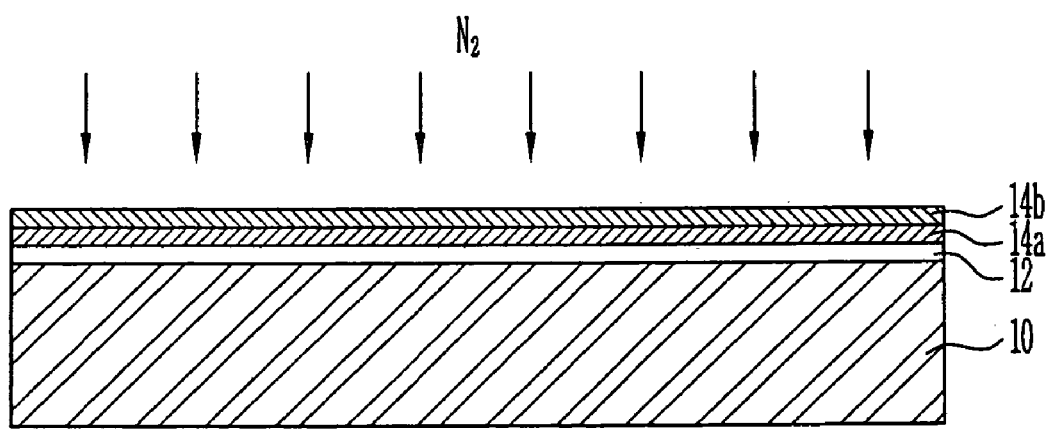

Referring to FIG. 5, the purge process of the second poly silicon film 14b is performed with the same conditions as those of N₂ purge process in FIG. 3. As shown in FIG. 8A, Si and N cause the substitution reaction on the upper part of the first poly silicon film 14a. Thus, as shown in FIG. 8B, N comes to dominate on the upper part of the first poly silicon film 14a compared to Si. Accordingly, the grain boundary structure comes to change in the upper part of the second poly silicon film 14b like that of the first poly silicon film 14a.

Figure 6:
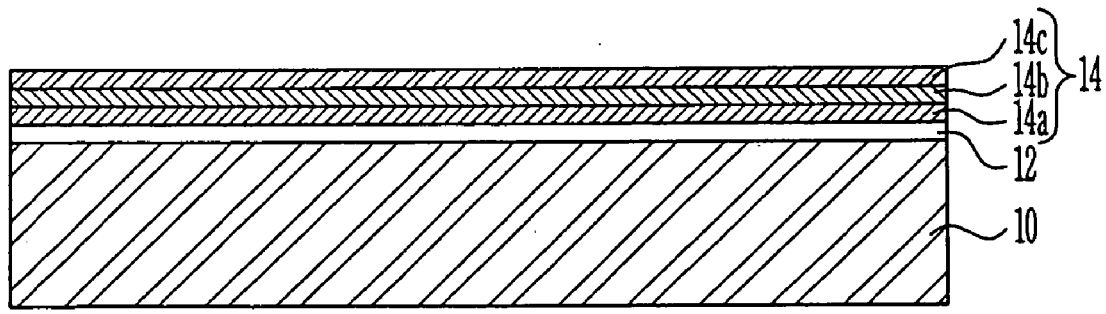

Referring to FIG. 6, the third poly silicon film 14c is deposited on the second poly silicon film 14a via the second process in the same manner of the first and the second process. The resulting poly silicon layer 14 is formed, said poly silicon layer 14 is composed of the films 14a or 14c having the different grain boundary structures from each other.

Through the aforementioned processes, the poly silicon layer 14 is made by the films having the different grain boundary structures. Thus, it is prevented that the solution (for example, HF, BOE) penetrates the lower layer 12, wherein the solution is used in the subsequent strip and cleaning processes. As each film of 14a through 14c has the different grain boundary structure at the contact area, it comes to be more difficult for the solution to penetrate it.

The poly silicon layer 14 described above has the structure including 3-layered film. However, as the above structure is made for illustrative purposes of the technical spirit through the preferred embodiment, the structure can be varied so as not to limit the scope of the present invention. The poly silicon layer 14 according to the preferred embodiment of the present invention can be made by 2-layered film, and also more than 4-layered film, not taking into consideration the difficulties in high-integration and process. In addition, by performing the $N_2$ purge process after deposition of each film, it is possible for the films to have the different grain boundary structures at the border faces. Further, the preferred embodiment of the invention is not limited to the poly silicon layer only, but any films are applicable, if their grain boundary structures at the border faces are variable through the $N_2$ purge process.

As an example, the case that a method for manufacturing a poly silicon layer in accordance with the preferred embodiment of the present invention is applied for fabricating a flash device will be introduced. A semiconductor substrate with a tunnel oxide film (not shown) deposited thereon is prepared, and a poly silicon layer, as described in FIGS. 1 to 6, according to the preferred embodiment of the present invention, is formed on a upper part of the tunnel oxide film. Next, a pad nitride film (not shown) is deposited thereto and a device separation film is formed via STI process, then a pad nitride strip process and a cleaning process (before deposition of the poly silicon film for a floating gate) are performed. In this case, it is possible to prevent the solution, like HF and BOE, from penetrating the tunnel oxide film, by the poly silicon layer having stacked films.

According to the present invention, it is possible to prevent a solution from penetrating a lower layer, by forming a poly silicon layer stacked with the films having the different grain boundary structures at border, wherein the solution is used in the subsequent strip and cleaning processes.

Therefore, the present invention can prevent the deterioration of the characteristic of a semiconductor device, caused by the damage of a lower layer, wherein the damage is generated by penetration of the chemical solution used in the manufacturing process of a flash device.

While the foregoing description has made with reference to the preferred embodiments, such description is for illustrative purposes only, and it is to be understood that changes and modifications of the present invention may be made by the ordinary skilled in the art without departing from the spirit and scope of the present invention and appended claims.

What is claimed is:

1. A method for manufacturing a semiconductor device comprising:
   providing a semiconductor substrate on which elements are formed;
   forming a first layer on the semiconductor substrate;
   performing a nitrogen purge process to change the grain boundary structure of an upper surface of the first layer such that the first layer has a first grain boundary structure; and
   forming a second layer having a second grain boundary structure on the first layer,
   wherein the first layer and the second layer are formed by sequentially performing a pre-deposition step, a deposition step and a pumping step, and the first layer and the second layer have different grain boundary structures.

2. The method of claim 1, wherein the first layer and the second layer comprise polysilicon.

3. The method of claim 1, wherein the nitrogen purge process is performed in situ during the forming of the lower film layer.

4. The method of claim 1, wherein the nitrogen purge process is performed with nitrogen gas at a pressure in the range of 0.1 Torr to 0.5 Torr and a temperature in the range of 580° C. to 650° C.

5. The method of claim 1, wherein the film having at least a lower film layer and an upper film layer is formed through a deposition process, and said deposition process is performed with silane gas at a pressure in the range of 0.1 Torr to 0.5 Torr and a temperature in the range of 580° C. to 650° C.

6. A method for manufacturing a semiconductor device comprising:
   providing a semiconductor substrate on which elements are formed;
   forming a first polysilicon film on the semiconductor substrate by sequentially performing a first pre-deposition step, a first deposition step and a first pumping step;
   performing a first nitrogen purge process to change the grain boundary structure of an upper surface of the first polysilicon film such that the first layer has a first grain boundary structure;
   forming a second polysilicon film on the first polysilicon film by sequentially performing a second pre-deposition step, a second deposition step and a second pumping step;
   performing a second nitrogen purge process to change the grain boundary structure of an upper surface of the second polysilicon film such that the second polysilicon film has a second grain boundary structure; and
   forming a third polysilicon film having a third grain boundary structure on the second polysilicon film by sequentially performing a third pre-deposition step, a third deposition step and a third pumping step,
   wherein the first, second and third polysilicon films have different grain boundary structures.

7. The method of claim 6, wherein the first and the second nitrogen purge process are performed with nitrogen gas at a pressure in the range of 0.1 Torr to 0.5 Torr and a temperature in the range of 580° C. to 650° C.

8. The method of claim 6, wherein the first, the second and the third polysilicon film are formed through a deposition process, and said deposition process is performed with silane gas at a pressure in the range of 0.1 Torr to 0.5 Torr and a temperature in the range of 580° C. to 650° C.

* * * * *